United States Patent
Foley et al.

(10) Patent No.: US 9,917,579 B2
(45) Date of Patent: Mar. 13, 2018

(54) LOW POWER CONSUMPTION DIODE SWITCH

(71) Applicant: MACOM Technology Solutions Holdings, Inc., Lowell, MA (US)

(72) Inventors: Brendan Foley, Co. Wexford (IE); David Ryan, Bandon (IE); James Brogle, Merrimac, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 15/203,591

(22) Filed: Jul. 6, 2016

(65) Prior Publication Data
US 2018/0013425 A1 Jan. 11, 2018

(51) Int. Cl.
*H03K 17/74* (2006.01)
(52) U.S. Cl.
CPC ..... *H03K 17/74* (2013.01); *H03K 2217/0036* (2013.01)
(58) Field of Classification Search
CPC ..................................................... H03K 17/74

USPC ........................................... 327/503; 323/282
See application file for complete search history.

(56) References Cited

U.S. PATENT DOCUMENTS

| 9,331,570 B2 * | 5/2016 | McIntyre | H02M 3/155 |
| 2004/0041620 A1 * | 3/2004 | D'Angelo | H02M 3/07 327/534 |
| 2010/0073112 A1 * | 3/2010 | Ryou | H01P 1/15 333/262 |

* cited by examiner

*Primary Examiner* — Lincoln Donovan
*Assistant Examiner* — Metasebia Retebo
(74) *Attorney, Agent, or Firm* — Wolf, Greenfield & Sacks, P.C.

(57) ABSTRACT

A switching circuit includes a first diode coupled between a first terminal and a second terminal, a second diode coupled between the first terminal and a third terminal, and a bias circuit coupled to the first terminal and configured to bias the first diode on and the second diode off in a first switch state and to bias the first diode off and the second diode on in a second switch state, the bias circuit including a voltage converter configured to convert a fixed voltage to an intermediate voltage and a current source coupled in series with the voltage converter.

14 Claims, 10 Drawing Sheets

LOW POWER CONSUMPTION DIODE SWITCH

BACKGROUND

Technical Field

The disclosed technology relates to diode switches and, more particularly, to diode switches which control RF signals.

Discussion of Related Art

Diode switching circuits are commonly used in radio frequency (RF) communication equipment. For example, a diode switching circuit may be utilized as a transmit/receive switch to switch an antenna between a receiver and a transmitter. In a transmit mode, the transmitter is connected to the antenna, and the receiver is isolated from the antenna. In a receive mode, the antenna is connected to the receiver, and the transmitter is isolated from the antenna. Such diode switching circuits are required to handle high RF power depending on a particular application, while having a small physical size and low power consumption. In RF communication equipment which utilizes a circulator at the front end, a diode switching circuit may be utilized to protect the receiver in the transmit mode.

Existing switching circuits may include PIN diode switches coupled in series with a bias resistor. The switching circuit may operate at relatively high voltage and substantial diode current to ensure a low impedance in the on state of the diode and to ensure high isolation in the off state of the diode. By way of example only, a diode switch may operate at 28 V (volts) and 100 mA (milliamps), such that the diode has a current of 100 mA in the on state and has a reverse bias of 28 V in the off state. In some cases, the operating voltage is determined based on the supply voltages available in the system.

In such switching circuits, the bias resistor value is selected to set the diode bias current. In the example of 28 V and 100 mA operating conditions, the diode voltage is one volt or less, such that the bias resistor operates at 27 V and 100 mA and thereby dissipates 2.7 watts. The power dissipated in the resistor must be removed from the switching circuit to avoid overheating. Further, a resistor having a relatively large physical size is required. The combination of large physical size and power dissipation is problematic for highly miniaturized electronic equipment, such as mobile phones and other compact equipment. For example, base station equipment form factors are shrinking aggressively, and thermal management and efficiency are major concerns. In addition, the power required to bias the diode switch may be unacceptable in the case of battery-operated equipment.

Accordingly, there is a need for improved diode switching circuits.

SUMMARY

The inventors have discovered that a diode switching circuit having low power consumption can be achieved by utilizing a current source and a voltage converter to supply bias current to the switching diode. The voltage converter converts a fixed voltage, such as a supply voltage, to an intermediate voltage that is lower than the fixed voltage, and the current source operates at the intermediate voltage. The intermediate voltage can be at or above the voltage required for operation of the diode and the current source connected in series. The diode switching circuit exhibits low power consumption and can be miniaturized.

In some embodiments, a switching circuit comprises a first diode coupled between a first terminal and a second terminal, a second diode coupled between the first terminal and a third terminal, and a bias circuit coupled to the first terminal and configured to bias the first diode on and the second diode off in a first switch state and to bias the first diode off and the second diode on in a second switch state, the bias circuit including a voltage converter configured to convert a fixed voltage to an intermediate voltage and a current source coupled in series with the voltage converter.

In some embodiments, the switching circuit further comprises a switch control circuit coupled to the second terminal and to the third terminal to control the first and second diodes in the first switch state or the second switch state.

In some embodiments, the first switch state is a transmit mode and the second switch state is a receive mode.

In some embodiments, the voltage converter comprises a switching power supply.

In some embodiments, the current source is configured to supply a fixed current.

In some embodiments, the current source is configured to supply a programmable current.

In some embodiments, the switching circuit further comprises a second bias circuit coupled between the third terminal and a fourth terminal.

In some embodiments, the second bias circuit includes a third diode, a second current source and a second voltage converter coupled in series between the third terminal and the fourth terminal.

In some embodiments, the first and second diodes comprise PIN diodes configured for high frequency operation.

In some embodiments, a switching circuit comprises a diode coupled between a first terminal and a second terminal; a bias circuit coupled to the diode and configured to supply a bias current to the diode when the diode is controlled in an on state, the bias circuit including: a voltage converter configured to convert a fixed voltage to an intermediate voltage; and a current source coupled in series with the voltage converter; and a switch control circuit coupled to the second terminal and configured to control the diode in the on state or an off state in response to a control signal.

In some embodiments, a switching circuit comprises a first diode coupled between a first terminal and a second terminal; a second diode coupled between the first terminal and a third terminal; and a bias circuit coupled to the first terminal and configured to bias the first diode on and the second diode off in a first switch state and to bias the first diode off and the second diode on in a second switch state, the bias circuit including a current source.

BRIEF DESCRIPTION OF DRAWINGS

The disclosed technology may be understood with reference to the accompanying drawings, which are incorporated herein by reference and in which.

DETAILED DESCRIPTION

Figure 1:
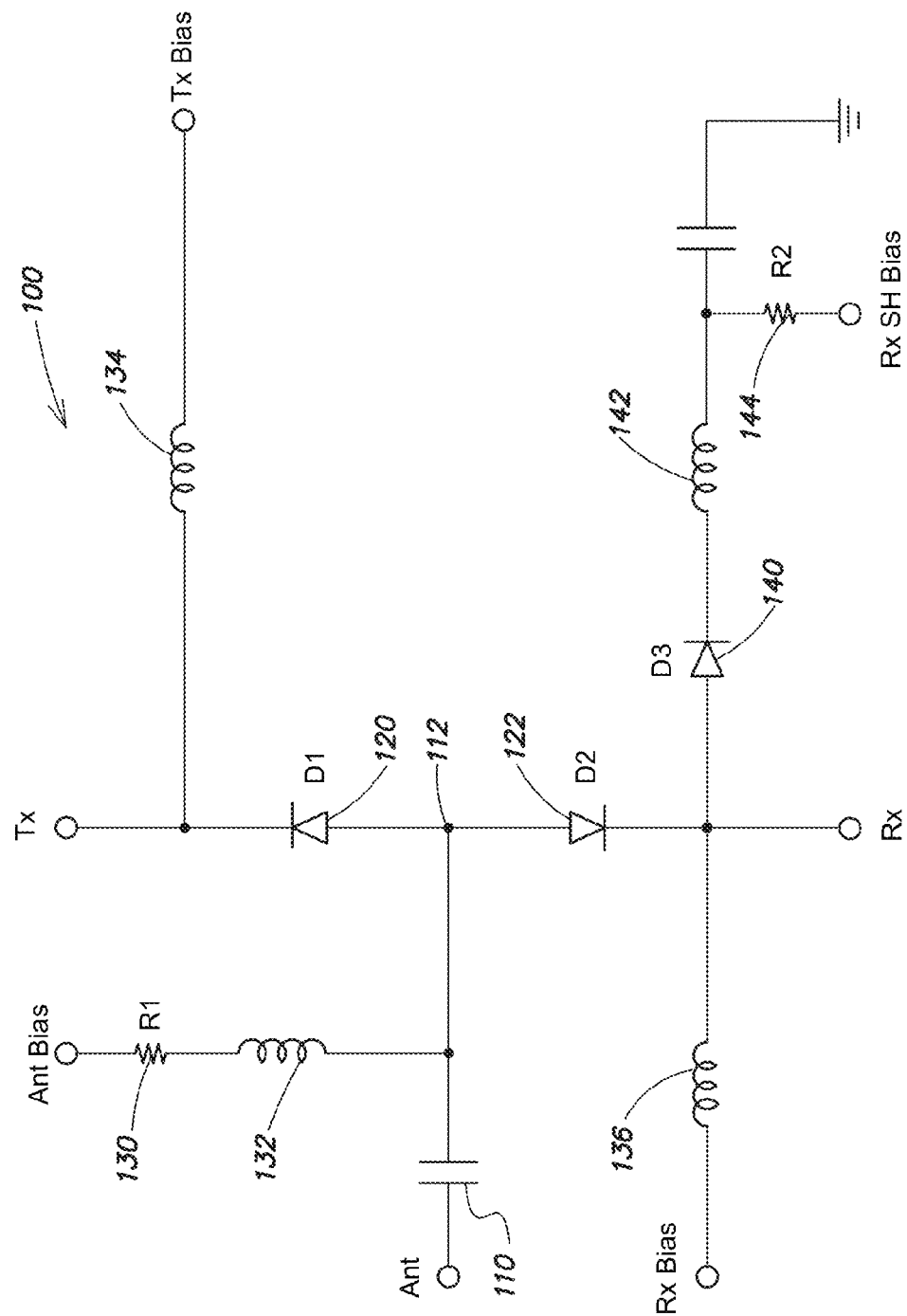
FIG. 1 is a schematic diagram of a conventional diode switching circuit.
Figure 2:
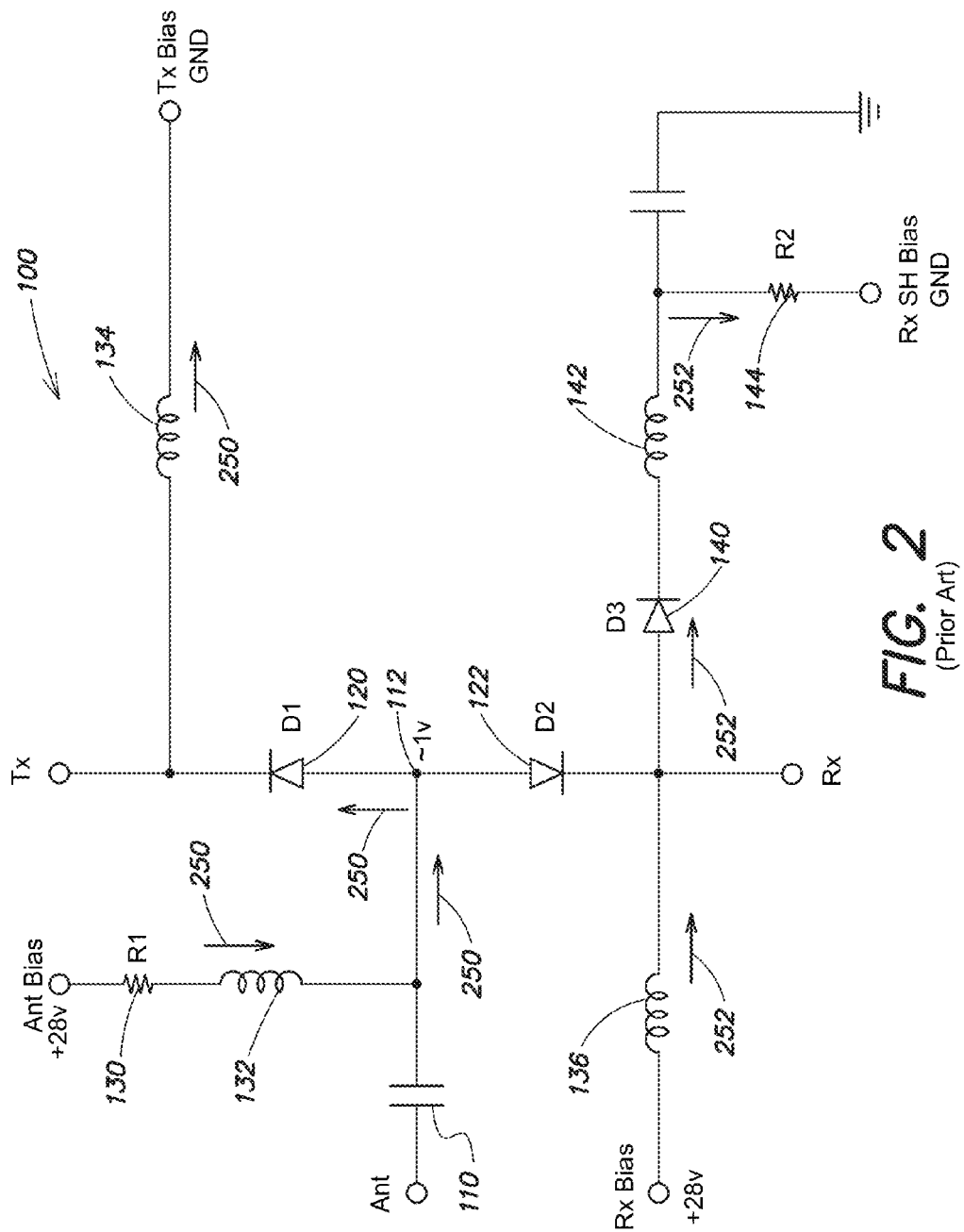
FIG. 2 is a schematic diagram of the diode switching circuit of FIG. 1, biased in the transmit mode.
Figure 3:
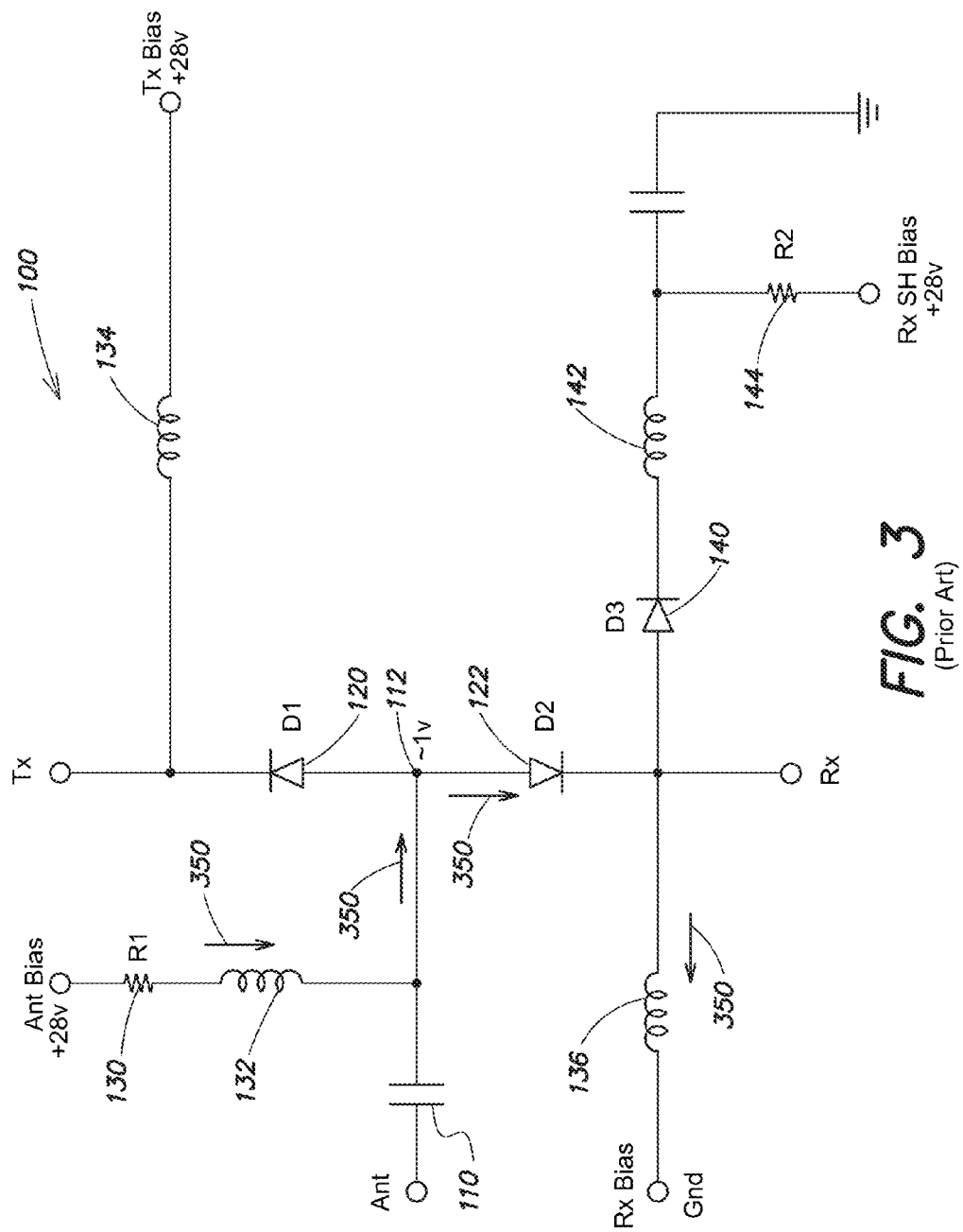
FIG. 3 is a schematic diagram of the diode switching circuit of FIG. 1, biased in the receive mode.

A conventional diode switching circuit 100 is shown in FIGS. 1-3. An antenna terminal ANT is coupled through a capacitor 110 to a common node 112. The node 112 is coupled through a first diode 120 to a transmit terminal TX and is coupled through a second diode 122 to a receive terminal RX. The cathode of diode 120 is connected to the transmit terminal TX, and the cathode of diode 122 is connected to the receive terminal RX. The diodes 120, 122 may be high frequency PIN diodes. An antenna bias terminal ANT BIAS is coupled through a resistor 130 and an inductor 132 to node 112. A transmit bias terminal TX BIAS is coupled through an inductor 134 to the transmit terminal TX. A receive bias terminal RX BIAS is coupled through an inductor 136 to the receive terminal RX. A third diode 140, an inductor 142 and a resistor 144 are connected in series between the receive terminal RX and a receive shunt bias terminal RX SH BIAS.

Operation of the conventional diode switching circuit 100 is described with reference to FIGS. 2 and 3. A transmit mode is illustrated in FIG. 2, and a receive mode is illustrated in FIG. 3. The operating mode of the switching circuit is established by application of appropriate control voltages to the antenna bias terminal, the transmit bias terminal, the receive bias terminal, and the receive shunt bias terminal. In the example of FIGS. 2 and 3, the bias voltage is +28 V and the diode current is 100 mA.

Referring to FIG. 2, the switching circuit 100 is placed in the transmit mode by applying +28 V to the antenna bias terminal and a reference voltage, such as ground, to the transmit bias terminal. In addition, a bias voltage of +28 V is applied to the receive bias terminal, and a reference voltage, such as ground, is applied to the receive shunt bias terminal. These bias conditions cause diode 120 to be turned on such that a current flows from the antenna bias terminal through resistor 130, inductor 132, diode 120 and inductor 134 to the grounded transmit bias terminal, as indicated by arrows 250 in FIG. 2. A voltage of approximately one volt or less, corresponding to the forward voltage of diode 120, appears at node 112. The value of resistor 130 is selected to provide a current of 100 mA through diode 120. Accordingly, the operating conditions for resistor 130 are 27 V and 100 mA, for a power dissipation of about 2.7 watts.

The bias voltage applied to the receive bias terminal and the receive shunt bias terminal causes a current to flow through inductor 136, diode 140, inductor 142 and resistor 144, as indicated by arrows 252 in FIG. 2. Since the receive terminal RX is biased at +28 V and node 112 is at approximately one volt or less, diode 122 is reverse biased. Under these operating conditions, the transmit terminal TX is coupled to the antenna terminal ANT through forward biased diode 120, and the receive terminal RX is isolated from the antenna terminal ANT by the reverse biased diode 122.

Referring now to FIG. 3, the switching circuit 100 is placed in the receive mode by applying +28 V to the antenna bias terminal, applying +28 V to the transmit bias terminal, applying a reference voltage, such as ground, to the receive bias terminal and applying +28 V to the receive shunt bias terminal. Under these bias conditions, a bias current flows from the antenna bias terminal through resistor 130, inductor 132, diode 122 and inductor 136 to the grounded receive bias terminal, as indicated by arrows 350 in FIG. 3. Diodes 120 and 140 are both reverse biased and do not carry a current. Again, node 112 operates at about one volt or less, corresponding to the forward voltage of diode 122, and resistor 130 dissipates about 2.7 watts. In the receive mode, the receive terminal RX is connected to the antenna terminal ANT through forward biased diode 122, and the transmit terminal TX is isolated from the antenna terminal ANT by the reverse biased diode 120. It may be noted that resistor 130 dissipates about 2.7 watts, in this example, in both the transmit mode and the receive mode.

Figure 4:
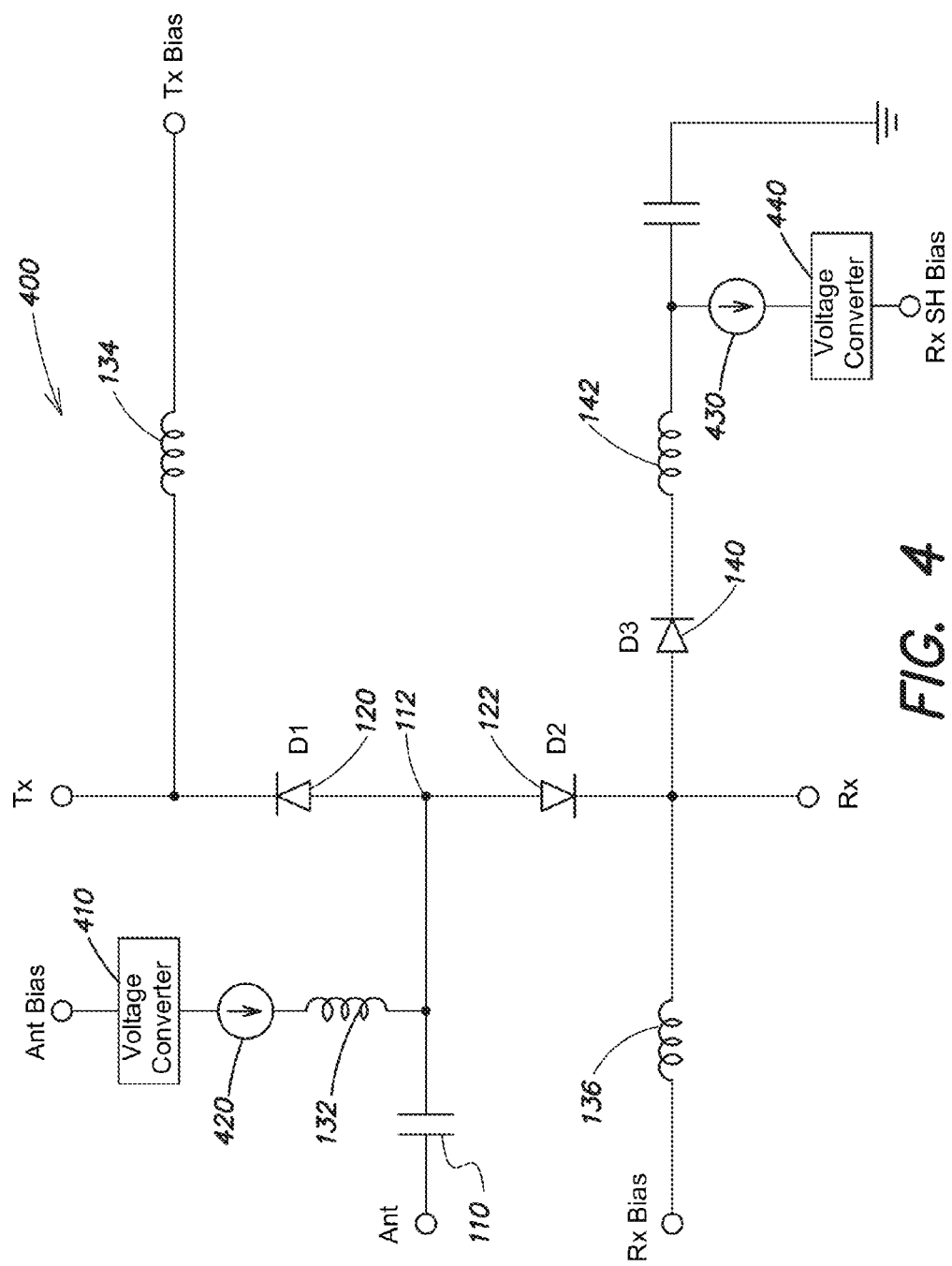
FIG. 4 is a schematic diagram of a diode switching circuit in accordance with embodiments.
Figure 5:
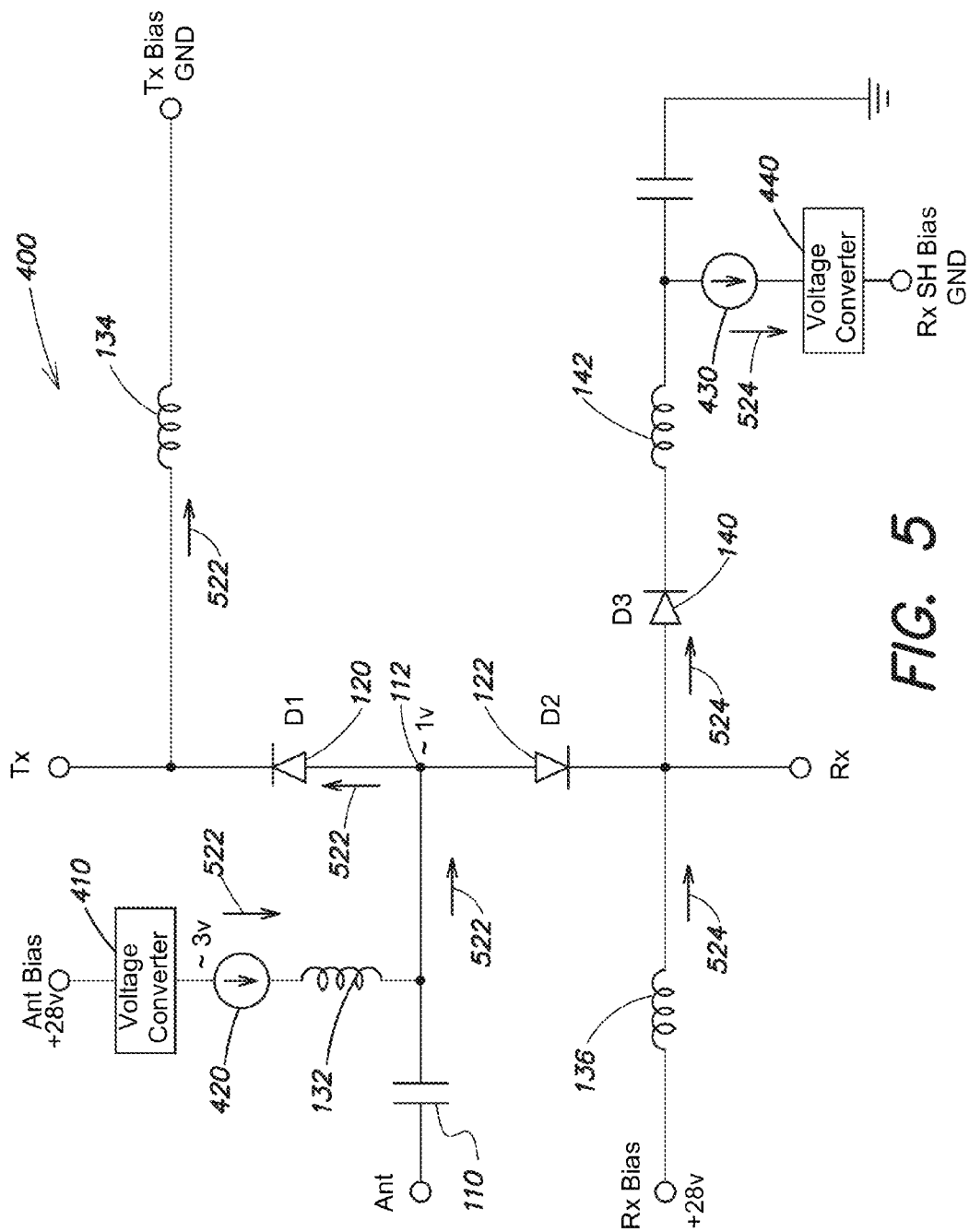
FIG. 5 is a schematic diagram of the diode switching circuit of FIG. 4, biased in the transmit mode.
Figure 6:
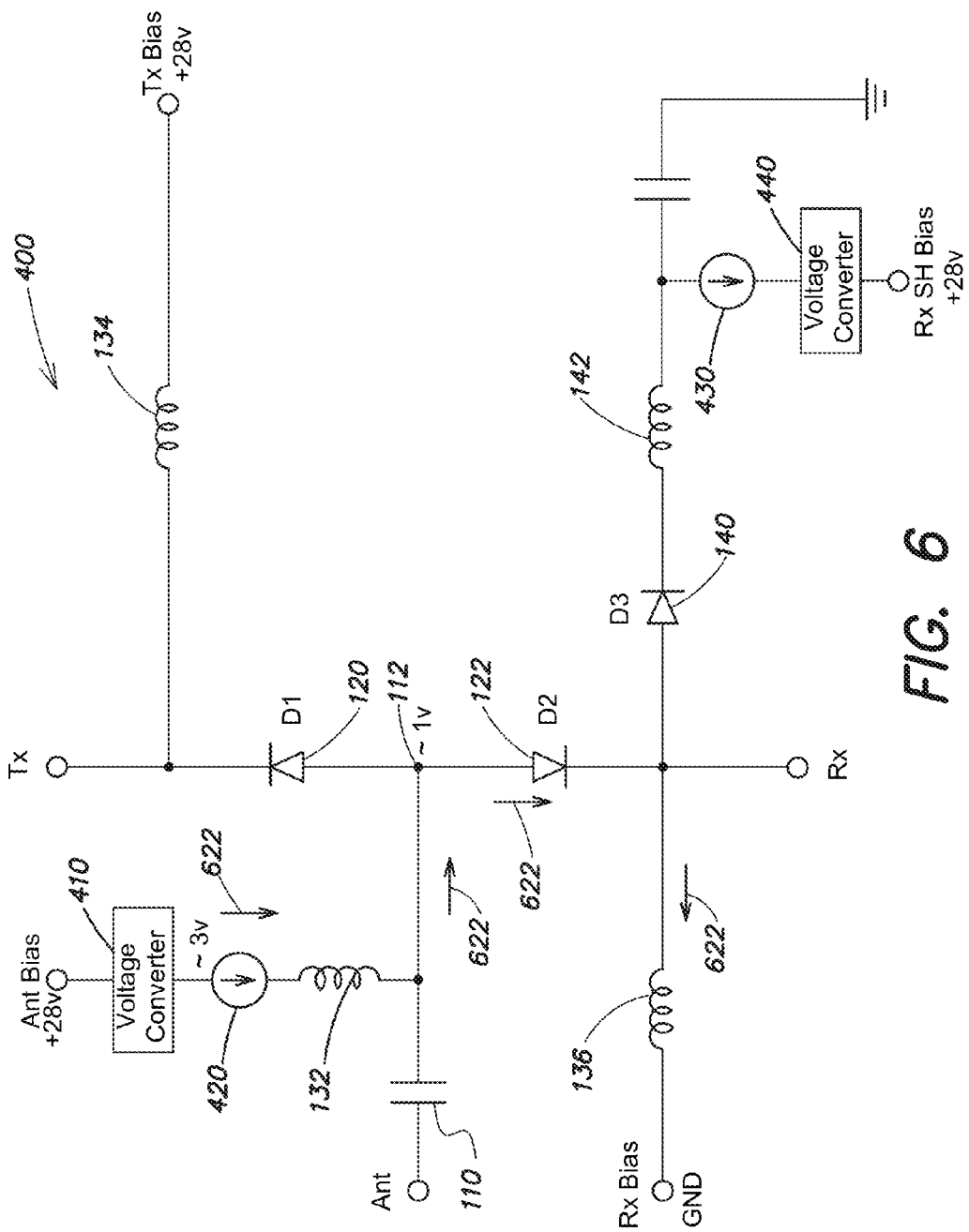
FIG. 6 is a schematic diagram of the diode switching circuit of FIG. 4, biased in the receive mode.

A switching circuit 400 in accordance with embodiments is shown in FIGS. 4-6. Like elements in FIGS. 1 and 4 have the same reference numerals, and their descriptions are not repeated.

In the switching circuit 400 of FIG. 4, a voltage converter 410, a current source 420 and inductor 132 are connected in series between the antenna bias terminal and node 112. Thus, the resistor 130 of FIG. 1 is replaced by the voltage converter 410 and the current source 420 of FIG. 4. In addition, diode 140, inductor 142, a current source 430 and a voltage converter 440 are connected in series between receive terminal RX and receive shunt bias terminal RX SH BIAS. Thus, the resistor 144 of FIG. 1 is replaced by the current source 430 and the voltage converter 440 of FIG. 4.

Operation of the switching circuit 400 of FIG. 4 in the transmit mode is shown in FIG. 5. For the example of a +28 V bias voltage and a diode current of 100 mA, the bias terminals of the switching circuit are biased by the same voltages as in FIG. 2. In particular, the antenna bias terminal is biased at +28 V, the transmit bias terminal is biased at a reference voltage, such as ground, the receive bias terminal is biased at +28 V, and the receive shunt bias terminal is biased at a reference voltage, such as ground. The voltage converter 410 converts the antenna bias voltage of 28 V to an intermediate voltage less than the antenna bias voltage, and the current source 420 supplies the required current. The intermediate voltage may be set at a level, for example 3 volts, sufficient for operation of the current source 420 and the diode 120 connected in series.

In the transmit mode where diode 120 is forward biased, a current of 100 mA passes through the voltage converter 410, current source 420, inductor 132, diode 120 and inductor 134 to the grounded transmit bias terminal, as indicated by arrows 522 in FIG. 5. The node 112 operates at about one volt or less, corresponding to the forward bias voltage of diode 120, and the input of current source 420 is at about 3 V. Accordingly, current source 420 dissipates about 0.2 watt at a current of 100 mA in the transmit mode.

In the transmit mode, the transmit terminal TX is connected to the antenna terminal ANT through the forward-biased diode 120, and the receive terminal RX is isolated from the antenna terminal ANT by the reverse-based diode 122. The voltage converter 410, which for example can be a switching power supply, can operate at high efficiency and low power dissipation. Accordingly, the total power dissipation is improved in comparison with the switching circuit of FIG. 1.

In the transmit mode, the current flows from the receive bias terminal through inductor 136, diode 140, inductor 142, current source 430 and voltage converter 440 to the receive shunt bias terminal, as indicated by arrows 524 in FIG. 5. The voltage converter 440 provides a voltage of about 25 V at its output, so that a voltage of about 2 volts appears across current source 430. The voltage converter 440 can be a high efficiency switching regulator. In the transmit mode, the diode 122 is reverse biased by the +28 V bias applied to the receive bias terminal.

Operation of the switching circuit of FIG. 4 in the receive mode is shown in FIG. 6. For the example of a +28 V bias voltage and a diode current of 100 mA, the bias terminals of the switching circuit may be biased by the same voltages as shown in FIG. 3. In particular, the antenna bias terminal is biased at +28 V, the transmit terminal is biased at +28 V, the receive bias terminal is biased at a reference voltage, such as ground, and the receive shunt bias terminal is biased at +28 V. The voltage 410 converter converts the antenna bias voltage of 28 V to the intermediate voltage, and the current source 420 supplies the required current.

In the receive mode where diode 122 is forward biased, a current of 100 mA passes through voltage converter 410, current source 420, inductor 132, diode 122 and inductor 136 to the grounded receive bias terminal, as indicated by arrows 622 in FIG. 6. The node 112 operates at about one volt or less, corresponding to the forward bias voltage of diode 122, and the input of current source 420 is at about 3 volts. Accordingly, current source 420 dissipates about 0.2 watt at a current of 100 mA in the receive mode. The diode 120 is reverse biased by the +28 V bias applied to the transmit bias terminal. The diode 140 is reverse biased by the +28 V applied to the receive shunt bias terminal, and no current flows through the current source 430 to the voltage converter 440.

In the receive mode, the receive terminal RX is connected to the antenna terminal ANT through the forward-biased diode 122, and the transmit terminal TX is isolated from the antenna terminal ANT by the reverse-biased diode 120. For the example of +28 V and 100 mA, the current source 420 dissipates about 0.2 watt in both the transmit mode and the receive mode.

The voltage converter 410 and/or the voltage converter 440 may be implemented as a switched-mode DC/DC buck voltage converter, for example. In some applications, the supply voltages can be lower than 28 V and the voltage converter can be implemented as a DC/DC boost voltage converter. The voltage converter may also, optionally, include a linear regulator. DC/DC converters typically achieve conversion efficiencies of >85%. The voltage converter may dissipate on the order of 50 milliwatts for the example of 100 mA bias current and voltage conversion from 28 V to 3 V.

The switching circuit of FIG. 4 has been described in connection with an example utilizing a bias voltage of +28 V and a diode current of 100 mA. It will be understood that these voltage and current values are given by way of example only and are not limiting. For example, the different bias voltages and/or different diode currents may be utilized. The bias voltages may be positive, negative, or a combination of positive and negative bias voltages. The diode operating current may be selected according to the application.

The switching circuit of FIG. 4 is a single pole, double throw configuration. It will be understood that the technology described herein can be applied to different switching configurations, such as for example a single pole, single throw switch, a double pole, double throw switch, and the like. In some embodiments, the diode switch is biased by a voltage converter and a current source to reduce power dissipation in comparison with switching circuits that utilize a resistive bias circuit. In other embodiments, the diode switch biased by a current source and the voltage converter is not utilized. A current source may be utilized without a voltage converter, for example, in applications with low supply voltages.

In some embodiments, the current source 420, the current source 430, or both in the switching circuit 400 of FIG. 4 may be programmable. In particular, the current supplied by the current source 420, 430 may be programmed in response to a control input. A programmable current source may be useful, for example, in setting the bias currents of diodes 120 and 122 according to a particular application or operating condition. In particular, the use of programmable current sources allows the end user to dynamically adjust the RF performance, including the insertion loss and the isolation, of the switching circuit. The current control may be analog or digital.

Figure 7:
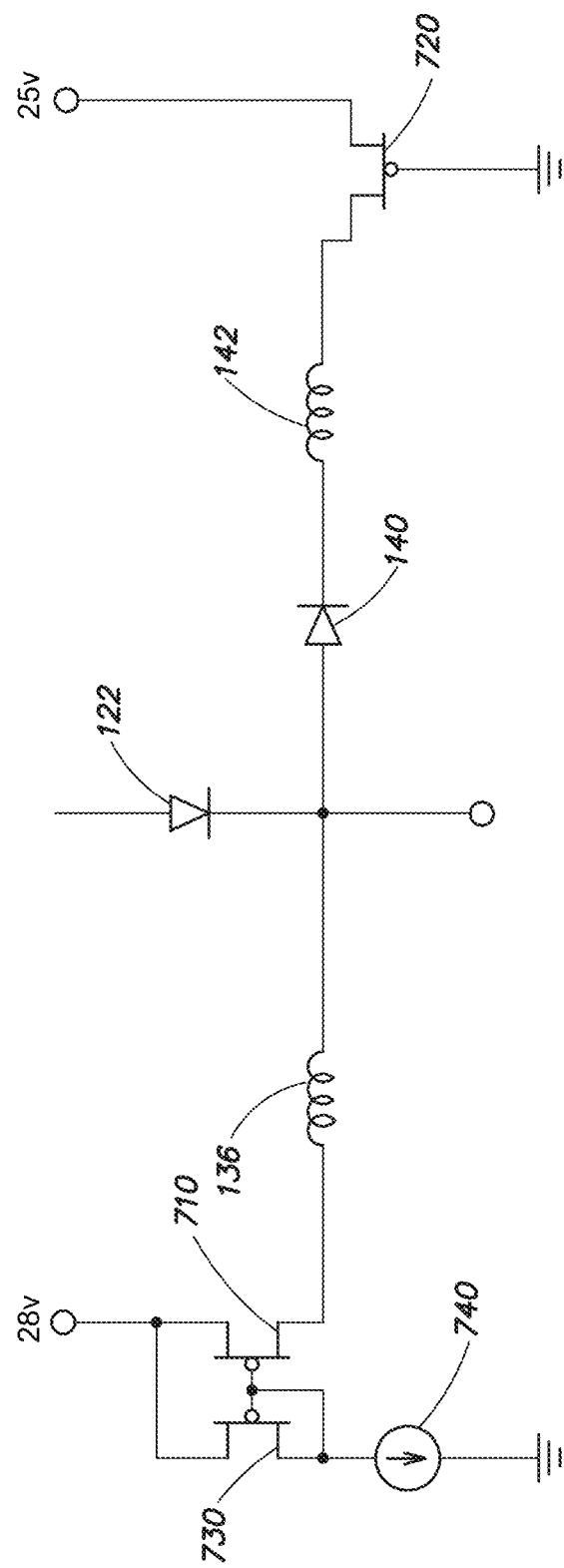
FIG. 7 is a schematic diagram of an implementation of a biasing circuit, in accordance with embodiments.

An implementation of a circuit for biasing diode 140 is shown in FIG. 7. The anode of diode 140 is connected to the receive terminal RX and in this example is biased with a current source. The current source is implemented as a p-channel MOSFET transistor 710 connected between the anode of diode 140 and the supply voltage, in this example 28 V. The cathode of the diode 140 is connected through inductor 142 to a p-channel MOSFET transistor 720 operated as a bias switch to a lower voltage, such as 25 V. The gate of transistor 710 is connected to the gate and to the source of a transistor 730. A current source 740, which may be programmable, is connected to the source of transistor 730. The arrangement of transistors 710 and 730 and current source 740 provides a current through transistor 710 as a bias for diode 140. It will be understood that the circuit of FIG. 7 is not limited to the use of p-channel MOSFET transistors.

Figure 8:
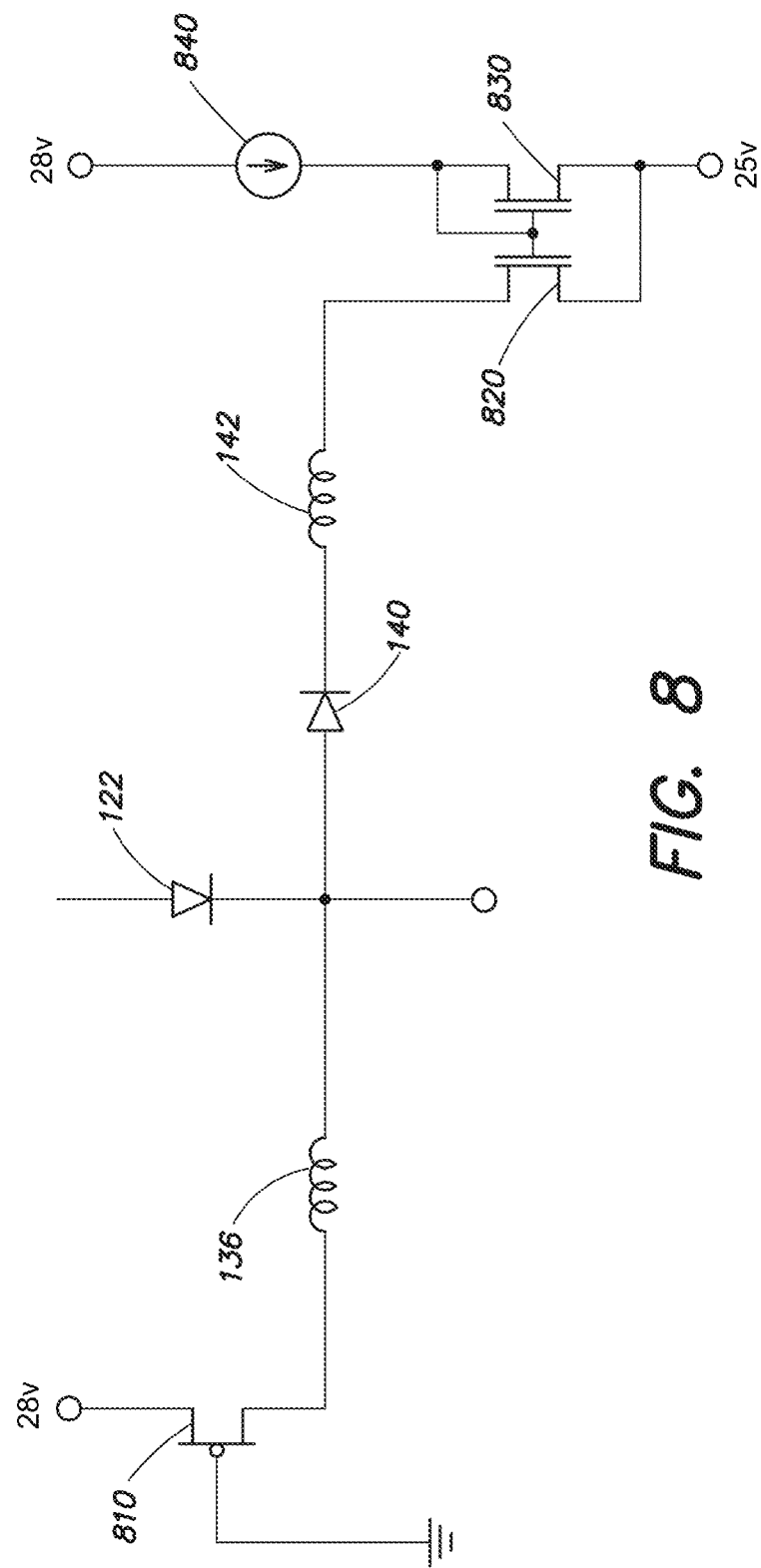
FIG. 8 is a schematic diagram of another implementation of a biasing circuit, in accordance with further embodiments.

A schematic diagram of another implementation of a circuit for biasing diode 140 is shown in FIG. 8. The anode of diode 140 is connected through inductor 136 to a p-channel MOSFET 810 operated as a bias switch, and the cathode of diode 140 is connected through inductor 142 and a current source to a lower voltage, for example 25 V. The current source includes a transistor 820 connected between the cathode of diode 140 and the lower voltage. The gate of transistor 820 is coupled to the gate and the source of a transistor 830, and a current source gate 840, which may be programmable, is connected to the drain of transistor 830. The current in transistor 820 varies in accordance with the current provided by current source 840.

FIGS. 7 and 8 illustrate examples of biasing circuits. It will be understood that a variety of different circuit implementations may be utilized to provide programmable or fixed current sources and intermediate voltages for reduced power consumption. The disclosed technology is not limited with respect to circuit details.

Figure 9:
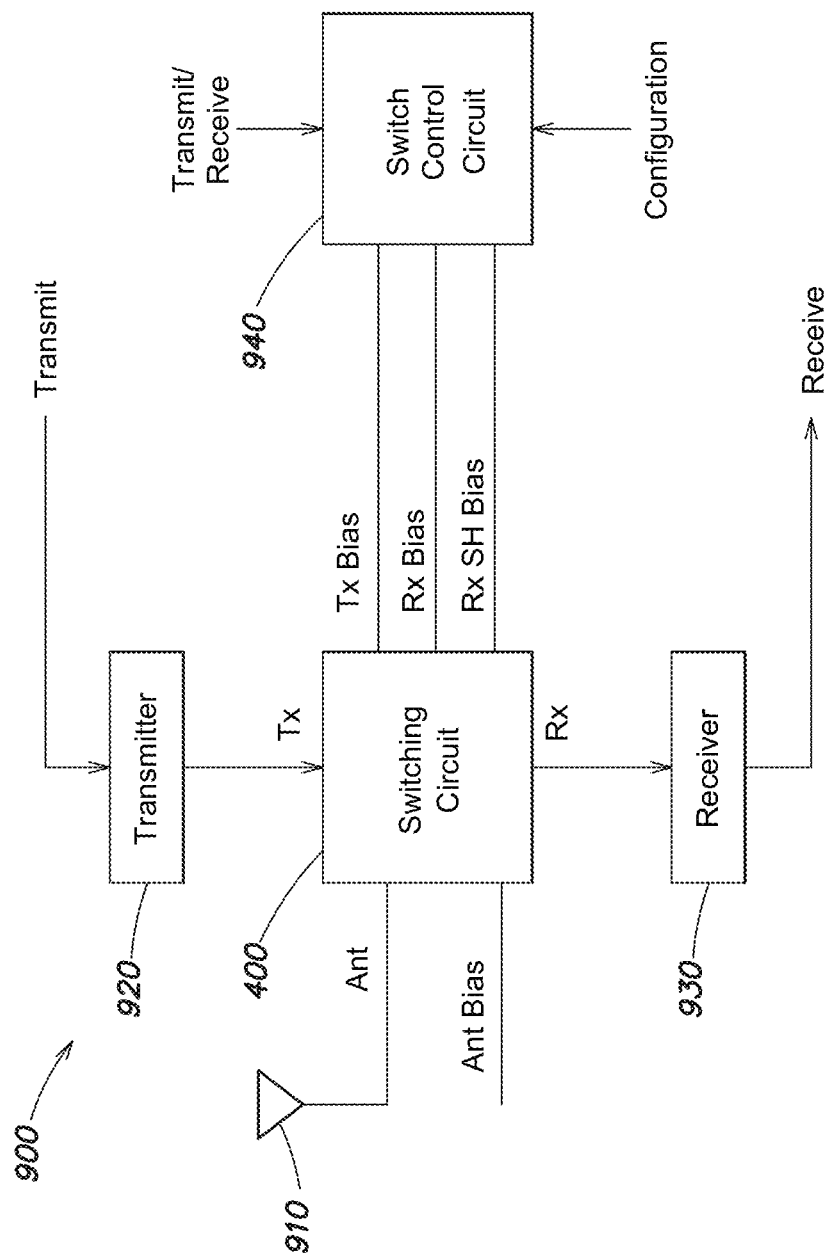
FIG. 9 is a schematic block diagram of a communication system incorporating the diode switching circuit, in accordance with embodiments.

A schematic block diagram of a communication system 900 incorporating the diode switching circuit 400 of FIG. 4 is shown in FIG. 9. The communication system includes switching circuit 400, an antenna 910, a transmitter 920, a receiver 930 and a switch control circuit 940. The communication system 900 is part of a larger system that provides transmit signals to transmitter 920, accepts received signals from receiver 930 and provides control signals to switch control circuit 940. As shown, the antenna 910 is connected to the antenna terminal ANT of switching circuit 400, the transmitter 920 is connected to the transmit terminal TX of switching circuit 400 and the receiver 930 is connected to the receive terminal RX of switching circuit 400.

The switch control circuit 940 supplies bias control signals to the transmit bias terminal TX BIAS, the receive bias terminal RX BIAS and the receive shunt bias terminal RX SH BIAS. The antenna bias terminal ANT BIAS may receive a control signal from switch control circuit 940 or may receive a system supply voltage. The bias control signals supplied by switch control circuit 940 to switching circuit 400 may be as shown in FIGS. 5 and 6 and described above. In an embodiment where one or both of the current sources 420 and 440 are programmable, the switch control circuit 940 may receive configuration signals from a host and may provide current program signals to switching circuit 400 in order to establish the current level of the current sources. The configuration signals may be digital or analog signals which adjust the voltages and/or currents of the TX, RX, RX Sh Bias, and/or ANT Bias terminals to optimize performance and in particular to optimize insertion loss and switch isolation.

As described above, the switching circuit 400 may operate in the transmit mode where the transmitter 920 is connected through switching circuit 400 to antenna 910. In the transmit mode, the receiver 930 is isolated from the antenna 910 by the switching circuit 400. In the receive mode, the receiver 930 is connected by switching circuit 400 to antenna 910, and the transmitter 920 is isolated from antenna 910.

Figure 10:
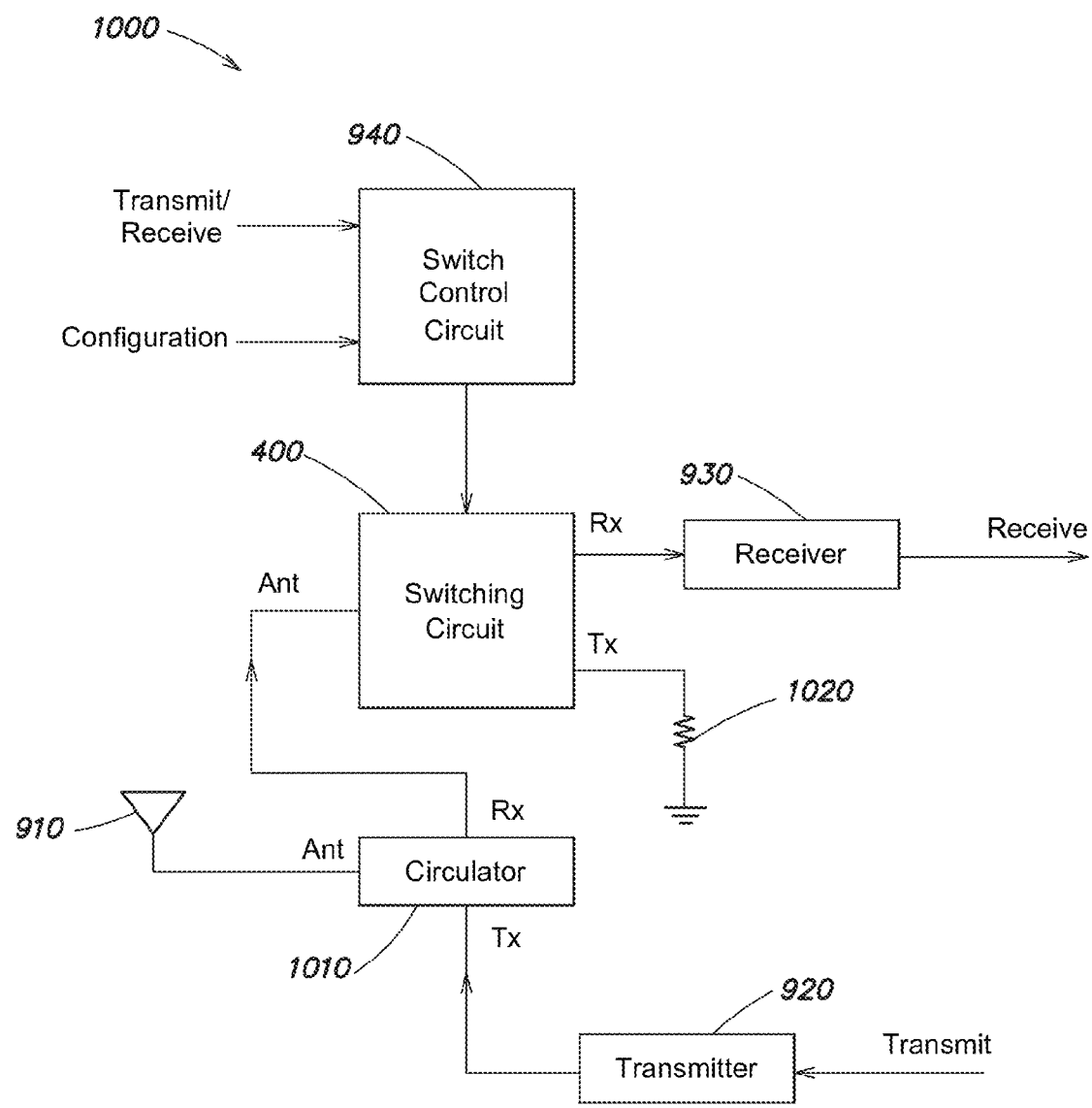
FIG. 10 is a schematic block diagram of a communication system incorporating the diode switching circuit, in accordance with further embodiments.

Another application of the switching circuit 400 is described with reference to FIG. 10. A communication system 1000 includes switching circuit 400, antenna 910, transmitter 920, receiver 930, switch control circuit 940 and a circulator 1010. The antenna 910 is connected to an antenna terminal ANT of circulator 1010, the transmitter 920 is connected to a transmit terminal TX of circulator 1010, and the antenna terminal ANT of switching circuit 400 is connected to a receive terminal RX of circulator 1010. The receiver 930 is connected to the receive terminal RX of switching circuit 400, and the transmit terminal TX of switching circuit 400 is connected to a load 1020.

In the receive mode, the antenna 910 is connected through circulator 1010 and switching circuit 400 to receiver 930, and transmitter 920 is isolated from antenna 910. In the transmit mode, the transmitter 920 is connected by circulator 1010 to antenna 910, and switching circuit 400 directs any part of the transmitted signal appearing on the receive terminal RX of circulator 1010 to load 1020. The switch control circuit 940 operates in the manner described above in connection with FIG. 9.

Having thus described several aspects of several embodiments of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:
1. A switching circuit comprising:
 a first diode coupled between a first terminal and a second terminal;
 a second diode coupled between the first terminal and a third terminal; and
 a bias circuit coupled to the first terminal and configured to bias the first diode on and the second diode off in a first switch state and to bias the first diode off and the second diode on in a second switch state, the bias circuit including:
  a voltage converter configured to convert a fixed voltage to an intermediate voltage; and
  a current source coupled in series with the voltage converter, wherein the current source is configured to supply a programmable current in response to a current program signal.
2. The switching circuit as defined in claim 1, further comprising a switch control circuit coupled to the second terminal and to the third terminal to control the first and second diodes in the first switch state or the second switch state.
3. The switching circuit as defined in claim 1, wherein the first switch state is a transmit mode and the second switch state is a receive mode.
4. The switching circuit as defined in claim 1, wherein the voltage converter comprises a switching power supply.
5. The switching circuit as defined in claim 1, further comprising a second bias circuit coupled between the third terminal and a fourth terminal.
6. The switching circuit as defined in claim 5, wherein the second bias circuit includes a third diode, a second current source and a second voltage converter coupled in series between the third terminal and the fourth terminal.
7. The switching circuit as defined in claim 1, wherein the first and second diodes comprise PIN diodes configured for high frequency operation.
8. A switching circuit comprising:
 a diode coupled between a first terminal and a second terminal;
 a bias circuit coupled to the diode and configured to supply a bias current to the diode when the diode is controlled in an on state, the bias circuit including:
  a voltage converter configured to convert a fixed voltage to an intermediate voltage; and
  a current source coupled in series with the voltage converter, wherein the current source is configured to supply a programmable current in response to a current program signal; and
 a switch control circuit coupled to the second terminal and configured to control the diode in the on state or an off state in response to a control signal.
9. The switching circuit as defined in claim 8, wherein the voltage converter comprises a switching power supply.
10. The switching circuit as defined in claim 8, wherein the diode comprises a high frequency PIN diode.
11. A switching circuit comprising:
 a first diode coupled between a first terminal and a second terminal;
 a second diode coupled between the first terminal and a third terminal; and
 a bias circuit coupled to the first terminal and configured to bias the first diode on and the second diode off in a first switch state and to bias the first diode off and the second diode on in a second switch state, the bias circuit including a current source, wherein the current source is configured to supply a programmable current in response to a current program signal.
12. The switching circuit as defined in claim 11, further comprising a switch control circuit coupled to the second terminal and to the third terminal to control the first and second diodes in the first switch state or the second switch state.

13. The switching circuit as defined in claim 11, wherein the first switch state is a transmit mode and the second switch state is a receive mode.

14. The switching circuit as defined in claim 11, further comprising a second bias circuit coupled between the third terminal and a fourth terminal.

* * * * *